(12) United States Patent
Jing

(10) Patent No.: US 12,009,720 B2
(45) Date of Patent: Jun. 11, 2024

(54) VOICE COIL MOTOR EQUIPPED WITH DAMPING SPRINGS, AND CAMERA DEVICE

(71) Applicant: New Shicoh Motor Co., Ltd, Zhejiang (CN)

(72) Inventor: Eryong Jing, Zhejiang (CN)

(73) Assignee: New Shicoh Motor Co., Ltd, Zhejiang (CN)

( * ) Notice: Subject to any disclaimer, the term of this patent is extended or adjusted under 35 U.S.C. 154(b) by 312 days.

(21) Appl. No.: 17/613,496

(22) PCT Filed: Jul. 23, 2020

(86) PCT No.: PCT/CN2020/103742
§ 371 (c)(1),
(2) Date: Nov. 23, 2021

(87) PCT Pub. No.: WO2021/139133
PCT Pub. Date: Jul. 15, 2021

(65) Prior Publication Data
US 2022/0247298 A1    Aug. 4, 2022

(30) Foreign Application Priority Data
Jan. 8, 2020    (CN) .................. 202010016982.9

(51) Int. Cl.
*H02K 41/035*    (2006.01)
*H04N 23/51*    (2023.01)
*H04N 23/54*    (2023.01)
*H05K 1/18*    (2006.01)

(52) U.S. Cl.
CPC ..... *H02K 41/0356* (2013.01); *H02K 41/0354* (2013.01); *H04N 23/51* (2023.01); *H04N 23/54* (2023.01); *H05K 1/189* (2013.01)

(58) Field of Classification Search
CPC .. H02K 41/0356; H02K 41/0354; H02K 5/24; H04N 23/51; H04N 23/54; H04N 23/55; H05K 1/189; F16F 1/14; F16F 1/16
See application file for complete search history.

(56) References Cited

U.S. PATENT DOCUMENTS

2017/0343886 A1    11/2017    Park et al.

FOREIGN PATENT DOCUMENTS

| CN | 202334715 | 7/2012 |
|----|-----------|--------|
| CN | 108169869 | 6/2018 |
| CN | 109975973 | 7/2019 |

(Continued)

OTHER PUBLICATIONS

WO2019155994A1 English translation (Year: 2023).*

(Continued)

*Primary Examiner* — Christopher M Koehler
*Assistant Examiner* — Viswanathan Subramanian
(74) *Attorney, Agent, or Firm* — JCIP GLOBAL INC.

(57) ABSTRACT

Disclosed are a damping spring, a voice coil motor equipped with damping springs, and a camera device. The damping spring includes a movable end connected to a rotor in a voice coil motor and a fixed end connected to a fixed part in the voice coil motor. A linear spring portion is disposed between the movable end and the fixed end, and the spring portion is provided with a plurality of damping structures bent in a serpentine shape.

6 Claims, 5 Drawing Sheets

(56) References Cited

FOREIGN PATENT DOCUMENTS

| | | | |
|---|---|---|---|
| CN | 111082637 | 4/2020 | |
| CN | 211508876 | 9/2020 | |
| WO | WO-2019155994 A1 * | 8/2019 | ......... G02B 13/0065 |

OTHER PUBLICATIONS

CN109975973A English translation (Year: 2023).*
"International Search Report (Form PCT/ISA/210) of PCT/CN2020/103742," mailed on Oct. 28, 2020, with English translation thereof, pp. 1-4.
"Written Opinion of the International Searching Authority (Form PCT/ISA/237) of PCT/CN2020/103742," mailed on Oct. 28, 2020, pp. 1-5.

* cited by examiner

VOICE COIL MOTOR EQUIPPED WITH DAMPING SPRINGS, AND CAMERA DEVICE

CROSS-REFERENCE TO RELATED APPLICATION

This application is a 371 of international application of PCT application serial no. PCT/CN2020/103742, filed on Jul. 23, 2020 which claims the priority benefit of China application no. 202010016982.9, filed on Jan. 8, 2020. The entirety of each of the above mentioned patent applications is hereby incorporated by reference herein and made a part of this specification.

TECHNICAL FIELD

The present invention relates to the field of voice coil motors, in particular to a damping spring, a voice coil motor equipped with damping springs, and a camera device.

DESCRIPTION OF RELATED ART

The main structure of the existing voice coil motor includes a housing, a gasket, an upper spring, magnets, coils, a holder, an FPC, a lower spring, and a base.

The working principle of the voice coil motor is that regular motion is produced by interaction between magnetic poles in a magnetic field generated by the permanent magnets and the powered coils, a carrier is pushed and pulled by the elasticity of the upper spring and the lower spring to move a lens under controlled current, the lens can move toward a defined direction, and then the purpose of moving the entire lens in a short distance to change the focal length and capture clear images can be achieved.

After the voice coil motor suddenly applies a relatively large current to the coils, the coils are accelerated by force, and will decelerate when encountering the upper spring and the lower spring. At this time, the coils are actually vibrating, and the lens is also vibrating along with the coils. This takes a long time to reach balance, and the vibration attenuates slowly, which is not conducive to focusing and affects the final image quality.

Therefore, it is necessary to improve such a structure to overcome the above shortcomings.

SUMMARY

The objective of the present invention is to provide a damping spring, a voice coil motor equipped with damping springs, and a camera device. The damping spring achieves a buffering effect, and ensures that a mover can effectively and quickly reduce vibration and reach a stationary state quickly when the mover is displaced up and down, and the damping spring can also automatically correct the concentricity of up and down movement of the mover to ensure the verticality of ascending and descending of the mover.

The above technical objective of the present invention is achieved by the following technical solution. A damping spring includes a movable end connected to a rotor in a voice coil motor and a fixed end connected to a fixed part in the voice coil motor. A linear spring portion is disposed between the movable end and the fixed end, and the spring portion is provided with a plurality of damping structures bent in a serpentine shape.

A further configuration of the present invention is: the damping structure, the movable end and the fixed end are located in a same plane.

A further configuration of the present invention is: both the movable end and the fixed end are provided with a connecting hole for convenient connection.

A further configuration of the present invention is: the movable end and/or the fixed end are provided with a plurality of the connecting holes.

A further configuration of the present invention is: a voice coil motor equipped with damping springs includes a housing, an upper spring, magnets, coils, a holder, an FPC, a base, and the abovementioned damping springs. The movable ends of the damping springs are fixed to the holder, and the fixed ends of the damping springs are fixed to the base.

A further configuration of the present invention is: there are four damping springs, and the four damping springs are respectively arranged at four corners of the holder.

A further configuration of the present invention is: the coils are fixed to the base, the magnets are fixed to side walls of the holder, the coils are connected to the FPC, and the FPC is fixed to an outer wall of the base.

A further configuration of the present invention is: magnetic conductive sheets respectively corresponding to the coils are disposed on the outer wall of the base.

A further configuration of the present invention is: corners of the holder are respectively provided with mounting grooves for respectively mounting the damping springs, a side wall of each of the mounting grooves is provided with a first lug connected to the connecting hole of the movable end, and an inner wall of the base is provided with a fixing groove connected to the connecting hole of the fixed end.

A further configuration of the present invention is: a camera device includes the abovementioned damping springs.

To sum up, the present invention has the following beneficial effects.

1) When the movable end and the fixed end move in the same direction or in opposite directions, the two serpentine damping structures achieve a damping and buffering effect, thereby effectively avoiding or reducing the vibration of the rotor connected to the movable end.

The connecting holes facilitates the connection of the damping spring with the rotor and fixed part of the voice coil motor, and the fixed end is provided with a plurality of connecting holes to facilitate the installation of the damping spring and adapt to the installation position of the voice coil motor.

In this application, the damping spring can achieve a buffering effect, and can ensure that a mover can effectively and quickly reduce vibration and reach a stationary state quickly when the mover is displaced up and down, and the damping spring can also automatically correct the concentricity of up and down movement of the mover to ensure the verticality of ascending and descending of the mover.

2) The structure of the voice coil motor is realized by replacing a lower spring with four damping springs, and the damping effect of the damping springs can effectively improve the stability of movement of the holder, increase the vibration attenuation speed of a lens, and achieve quick focus.

The connecting hole of the movable end of the damping spring is fixed to the first lug, the fixed end is inserted into the fixing groove, the fixing groove is glued, and the glue enters the connecting holes to fix the fixed end, so as to facilitate the fixed installation of the damping spring, improve the convenience of assembling the voice coil motor, and facilitate the fixation of the damping spring.

DESCRIPTION OF THE EMBODIMENTS

In order to make the technical means, creative features, objectives and effects of the present invention easy to understand, the present invention will be further explained below in conjunction with the drawings and specific embodiments.

Figure 1:
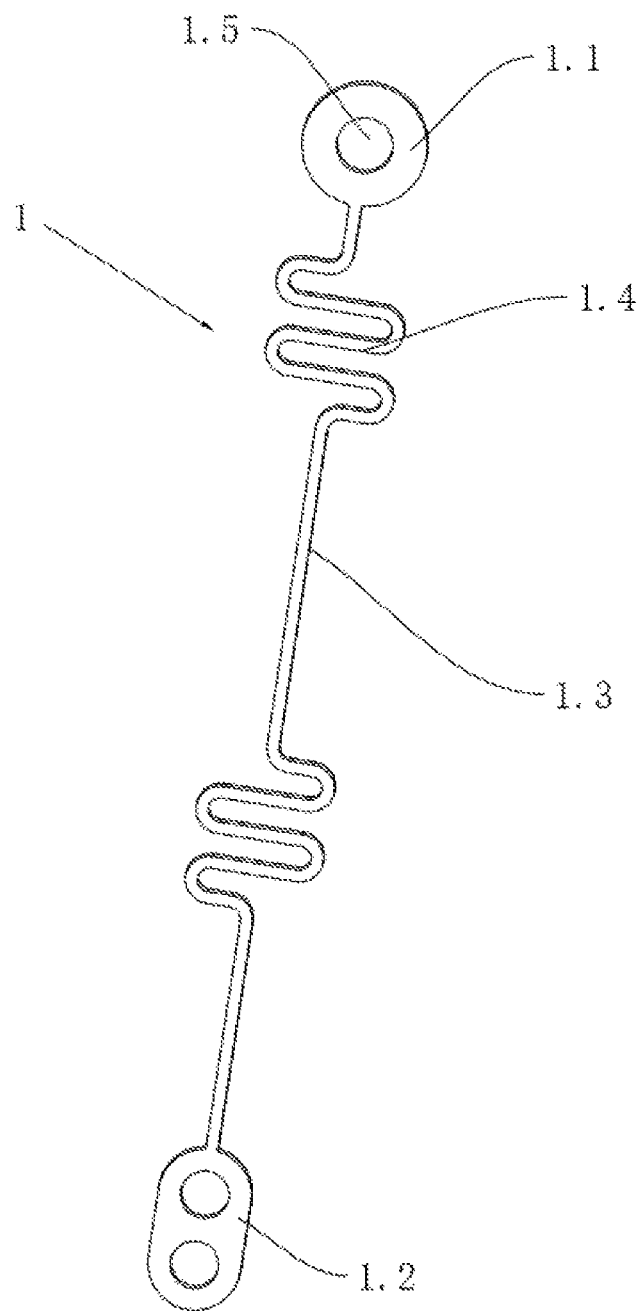
FIG. 1 is a schematic structural diagram of Embodiment 1.
Figure 2:
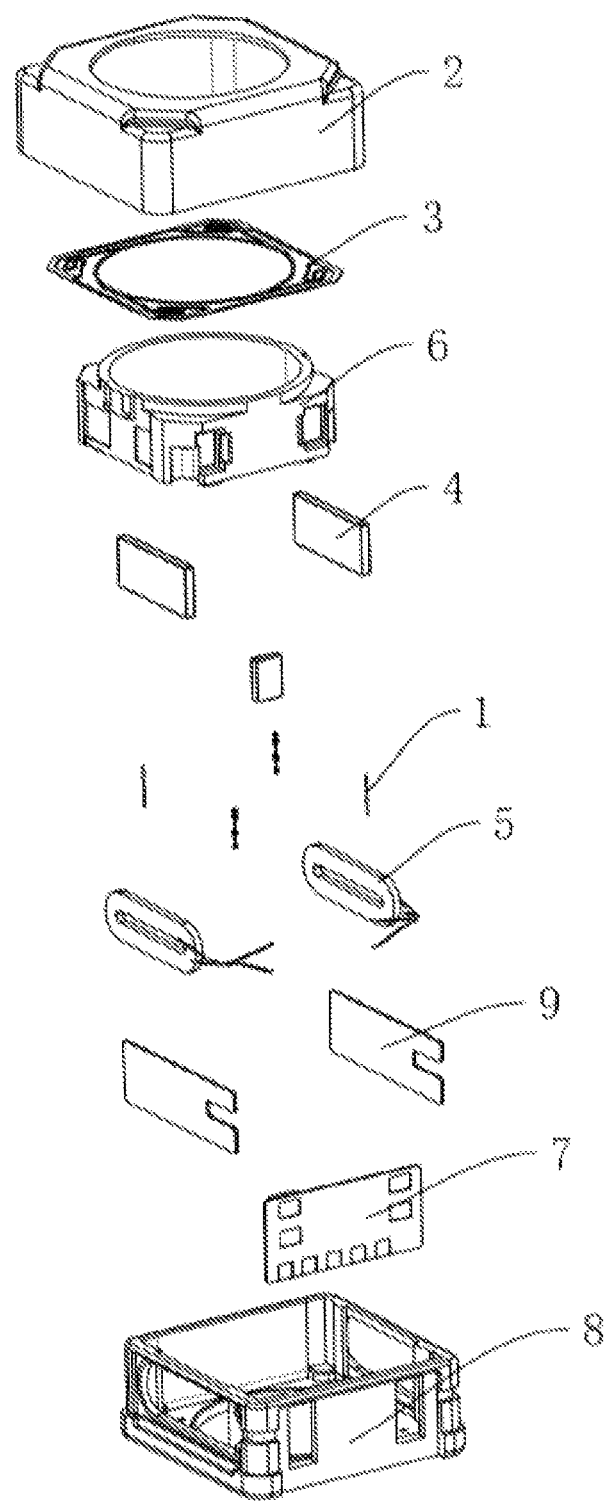
FIG. 2 is an exploded schematic diagram of Embodiment 2.
Figure 3:
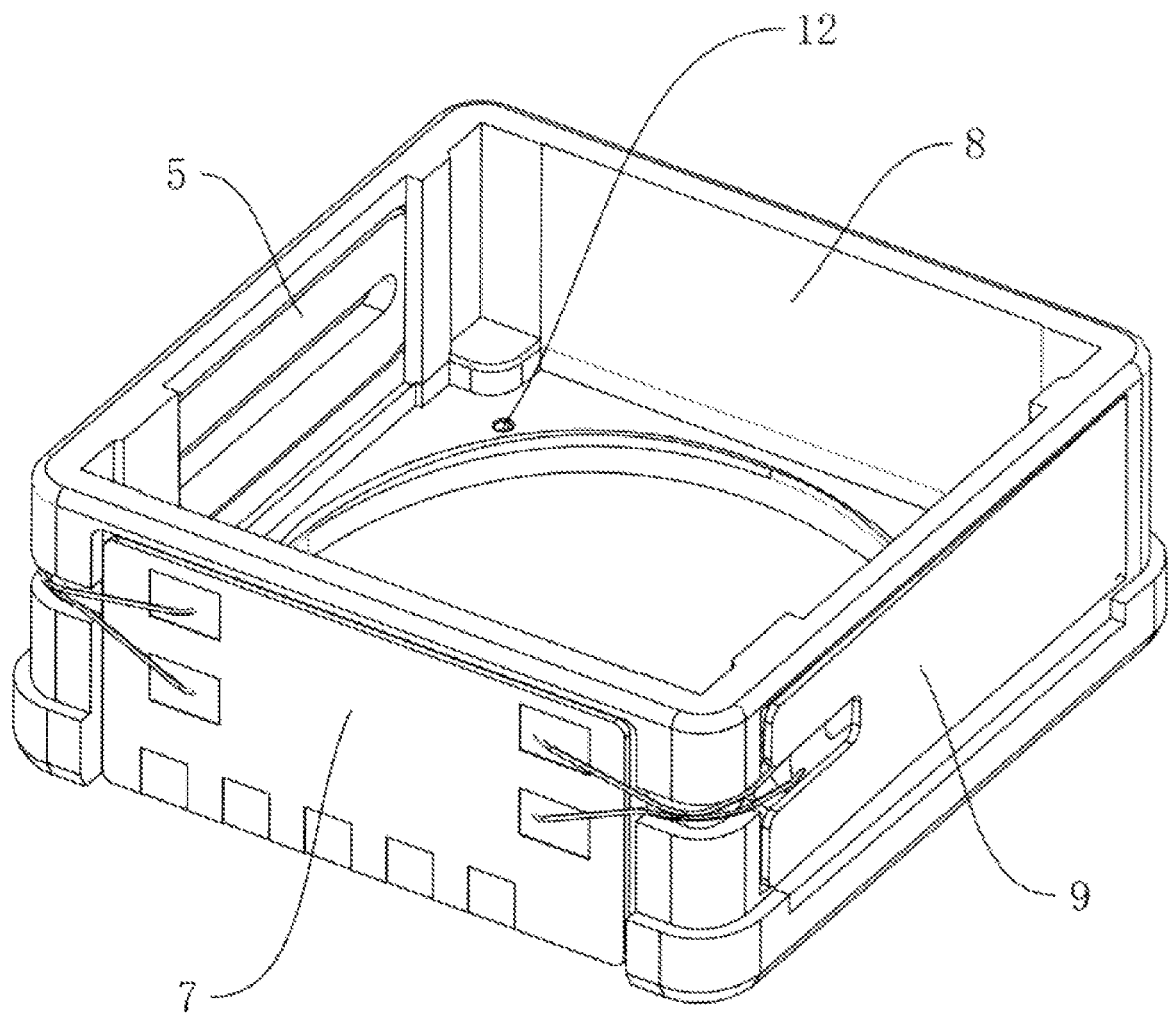
FIG. 3 is a first schematic structural diagram of some parts of Embodiment 2.
Figure 4:
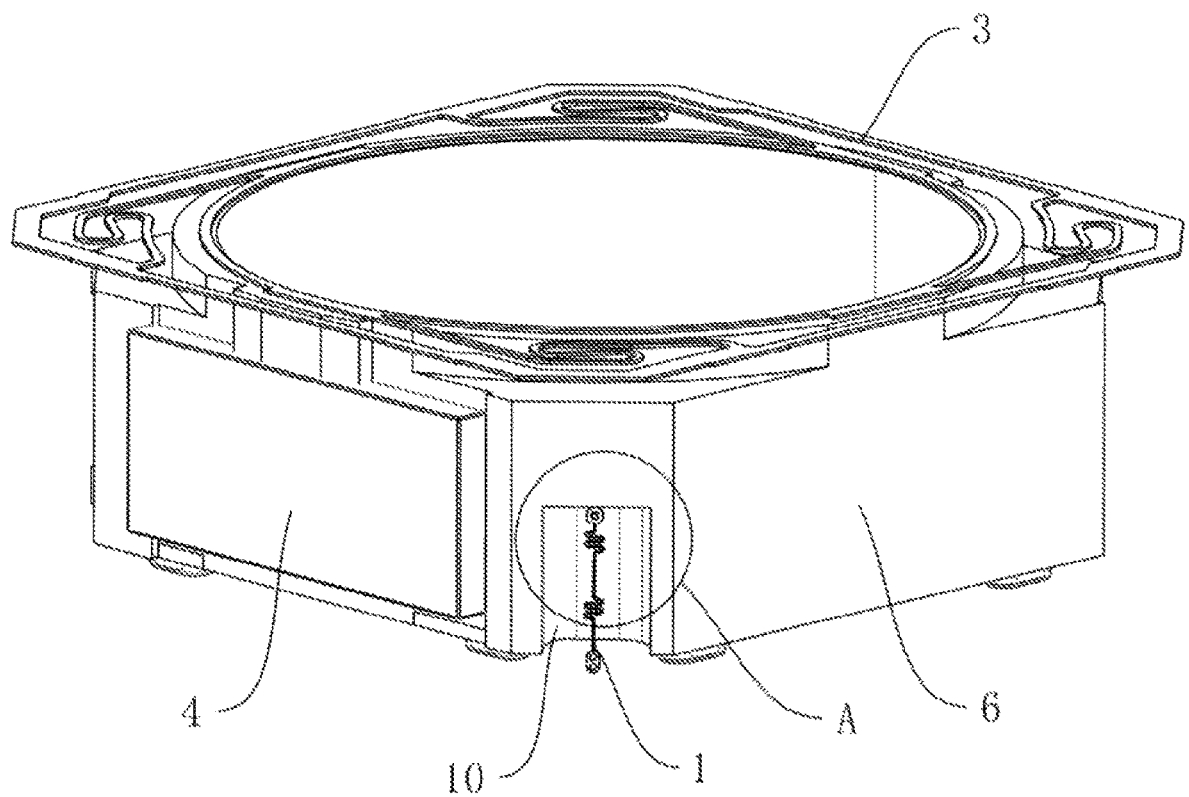
FIG. 4 is a second schematic structural diagram of some parts of Embodiment 2.
Figure 5:
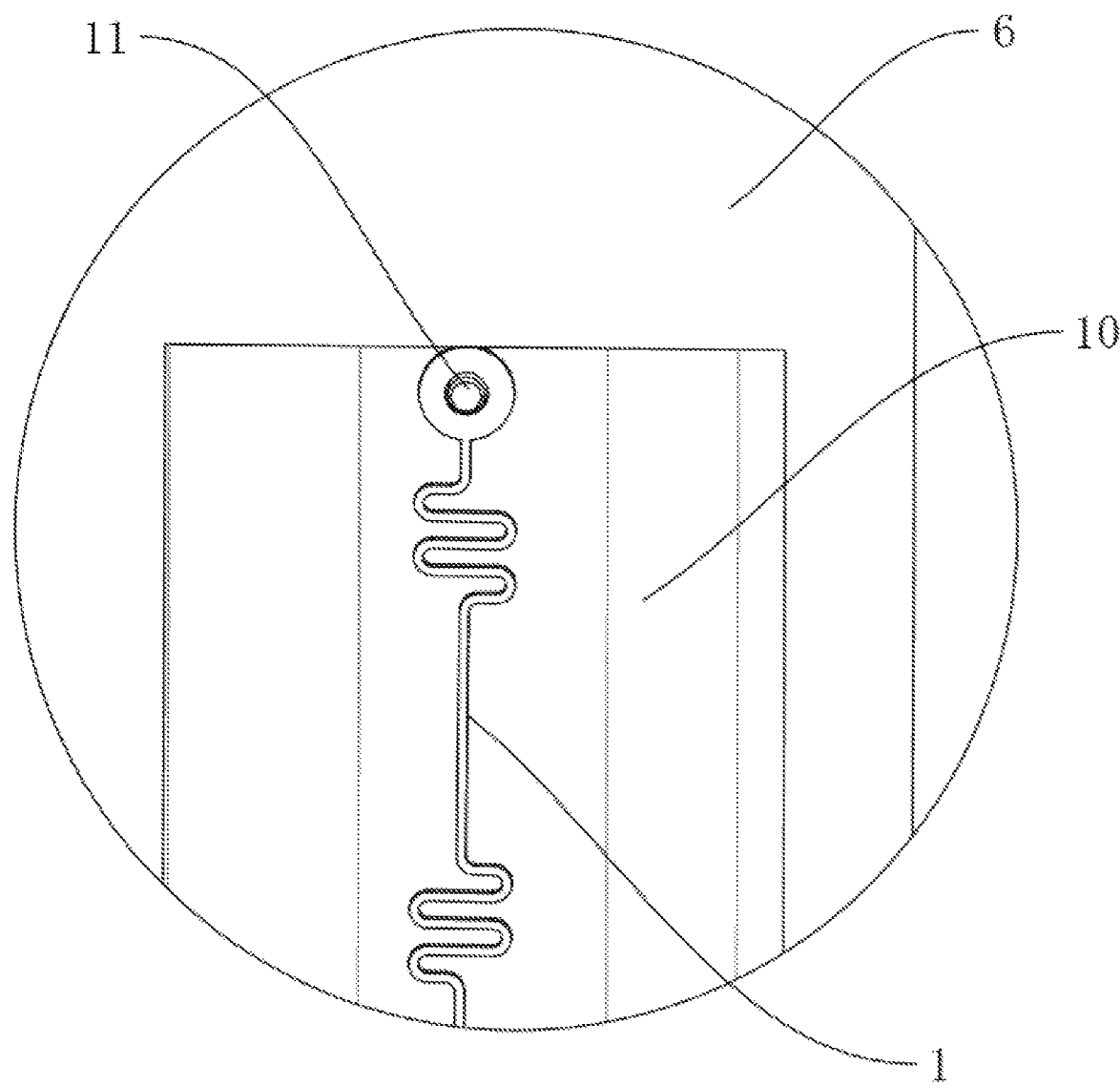
FIG. 5 is an enlarged view of part A of FIG. 4.

Embodiment 1: As shown in FIG. 1, a damping spring proposed by the present invention is characterized by including a movable end 1.1 connected to a rotor in a voice coil motor and a fixed end 1.2 connected to a fixed part in the voice coil motor. A linear spring portion 1.3 is disposed between the movable end 1.1 and the fixed end 1.2, and the spring portion 1.3 is provided with a plurality of damping structures 1.4 bent in a serpentine shape. Two damping structures 1.4 are adopted in this embodiment and arranged at intervals. The movable end 1.1, the spring portion 1.3 and the fixed end 1.2 are integrally formed. The movable end 1.1 and the fixed end 1.2 are flat, and the damping structures 1.4 are located in the same plane as the movable end 1.1 and the fixed end 1.2. This ensures that the entire damping spring 1 is flat, and when the movable end 1.1 and the fixed end 1.2 move in the same direction or in opposite directions, the two serpentine damping structures 1.4 achieve a damping and buffering effect, thereby effectively avoiding or reducing the vibration of the rotor connected to the movable end 1.1.

In this embodiment, both the movable end 1.1 and the fixed end 1.2 are provided with connecting holes 1.5 for convenient connection. The movable end 1.1 and the fixed end 1.2 may be provided with a plurality of connecting holes 1.5. In this embodiment, the fixed end 1.2 is provided with two connecting holes 1.5, which are arranged in the length direction of the damping spring 1. The connecting holes 1.5 facilitates the connection of the damping spring 1 with the rotor and fixed part of the voice coil motor, and the plurality of connecting holes 1.5 at the fixed end 1.2 facilitate the installation of the damping spring 1 and adapt to the installation position of the voice coil motor.

In this application, the damping spring 1 can achieve a buffering effect, and ensures that a mover can effectively and quickly reduce vibration and reach a stationary state quickly when the mover is displaced up and down, and the damping spring 1 can also automatically correct the concentricity of up and down movement of the mover to ensure the verticality of ascending and descending of the mover.

Embodiment 2: A voice coil motor equipped with the damping springs described in Embodiment 1, as shown in FIG. 2 to FIG. 5. The voice coil motor includes a housing 2, an upper spring 3, magnets 4, coils 5, a holder 6, a flexible printed circuit (FPC) 7, a base 8, and the damping springs 1 described in Embodiment 1. The movable ends 1.1 of the damping springs 1 are fixed to the holder 6, and the fixed ends 1.2 of the damping springs 1 are fixed to the base 8. There are four damping springs 1, and the four damping springs 1 are respectively arranged at four corners of the holder 6. The structure of the voice coil motor is realized by replacing a lower spring with four damping springs 1, and the damping effect of the damping springs 1 can effectively improve the stability of movement of the holder 6, increase the vibration attenuation speed of a lens, and achieve quick focus.

In this embodiment, the coils 5 are fixed to the inner wall of the base 8, the magnets 4 are fixed to side walls of the holder 6, the coils 5 are connected to the FPC 7, and the FPC 7 is fixed to the outer wall of the base 8. In addition, magnetic conductive sheets 9 corresponding to the coils 5 one to one are further disposed on the outer wall of the base 8, and the magnetic conductive sheets 9 are arranged opposite to the coils 5.

In this embodiment, the four corners of the holder 6 are provided with mounting grooves 10 for mounting the damping springs 1. A side wall of each of the mounting grooves 10 is provided with a first lug 11 connected to the connecting hole 1.5 of the movable end 1.1, and the inner wall of the base 8 is provided with a fixing groove 12 connected to the connecting holes 1.5 of the fixed end 1.2. The connecting hole 1.5 of the movable end 1.1 of the damping spring 1 is fixed to the first lug 11, the fixed end 1.2 is inserted into the fixing groove 12, the fixing groove 12 is glued, and the glue enters the connecting holes 1.5 to fix the fixed end 1.2, so as to facilitate the fixed installation of the damping spring 1, improve the convenience of assembling the voice coil motor, and facilitate the fixation of the damping spring 1.

Embodiment 3: A camera device. In this camera device, the damping springs 1 described in Embodiment 1 are used to realize rapid damping of a lens in the camera device and increase the focus speed.

The basic principles, main features and advantages of the present invention are shown and described above. Those skilled in the art should understand that the present invention is not limited by the above embodiments, the above embodiments and the description only illustrate the principles of the present invention, the present invention will have various changes and improvements without departing from the spirit and scope of the present invention, and these changes and improvements all fall within the scope of the present invention. The scope of the present invention is defined by the appended claims and equivalents thereof.

What is claimed is:

1. A voice coil motor equipped with damping springs, the voice coil motor comprising a housing, an upper spring, magnets, coils, a holder, a flexible printed circuit (FPC), a base, and a plurality of the damping springs, wherein each of the plurality of damping springs comprises a movable end connected to a rotor in the voice coil motor and a fixed end connected to a fixed part in the voice coil motor, wherein a linear spring portion is disposed between the movable end and the fixed end, and the spring portion is provided with a plurality of damping structures bent in a serpentine shape, wherein both the movable end and the fixed end are provided with at least one connecting hole, wherein the movable ends of the damping springs are fixed to the holder, and the fixed ends of the damping springs are fixed to the base, wherein the voice coil motor comprises four damping springs, and the four damping springs are respectively arranged at four corners of the holder, wherein corners of the holder are respectively provided with mounting grooves for respectively mounting the damping springs, a side wall of each of the mounting grooves is provided with a first lug connected to the connecting hole of the movable end, and an inner wall of the base is provided with a fixing groove connected to the connecting hole of the fixed end.

2. The voice coil motor equipped with damping springs according to claim 1, wherein the coils are fixed to the base, the magnets are fixed to side walls of the holder, the coils are connected to the FPC, and the FPC is fixed to an outer wall of the base.

3. The voice coil motor equipped with damping springs according to claim 2, wherein a plurality of magnetic conductive sheets respectively corresponding to the coils are disposed on the outer wall of the base.

4. A camera device, comprising a voice coil motor equipped with damping springs according to claim 1.

5. The voice coil motor equipped with damping springs according to claim 1, wherein the damping structure, the movable end and the fixed end are located in a same plane.

6. The voice coil motor equipped with damping springs according to claim 1, wherein the at least one connecting hole comprises a plurality of the connecting holes.

* * * * *